(12) United States Patent
Grenouillet et al.

(10) Patent No.: US 9,711,567 B2
(45) Date of Patent: Jul. 18, 2017

(54) PROCESS FOR FABRICATING AN INTEGRATED CIRCUIT COINTEGRATING A FET TRANSISTOR AND AN OXRAM MEMORY LOCATION

(71) Applicant: Commissariat a l'energie atomique et aux energies alternatives, Paris (FR)

(72) Inventors: Laurent Grenouillet, Grenoble (FR); Yves Morand, Grenoble (FR); Maud Vinet, La Haye Fouassiere (FR)

(73) Assignee: Commissariat A L'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 15/094,011

(22) Filed: Apr. 8, 2016

(65) Prior Publication Data
US 2016/0300884 A1  Oct. 13, 2016

(30) Foreign Application Priority Data

Apr. 9, 2015 (FR) ...................................... 15 53070

(51) Int. Cl.
*H01L 23/00* (2006.01)
*H01L 27/00* (2006.01)
(Continued)

(52) U.S. Cl.
CPC ...... *H01L 27/2436* (2013.01); *H01L 23/3107* (2013.01); *H01L 27/2463* (2013.01);
(Continued)

(58) Field of Classification Search
CPC ............. H01L 23/3107; H01L 23/5329; H01L 23/564; H01L 27/2436; H01L 27/101;
(Continued)

(56) References Cited

U.S. PATENT DOCUMENTS 6,391,801 B1 * 5/2002 Yang .................... G03F 7/16
                                            257/E21.027
7,800,094 B2 * 9/2010 Ho ...................... B82Y 10/00
                                            257/4

(Continued)

OTHER PUBLICATIONS

French Preliminary Search Report with Written Opinion issued Mar. 11, 2016 in French Application 15 53070 filed on Apr. 9, 2015 (with English Translation of Categories of Cited Documents).

(Continued)

*Primary Examiner* — Nikolay Yushin
(74) *Attorney, Agent, or Firm* — Oblon, McClelland, Maier & Neustadt, L.L.P.

(57) ABSTRACT

The invention relates to a process for fabricating an integrated circuit (1), comprising the steps of:
providing a substrate (100), the substrate being equipped with first and second dummy gates and with an encapsulation layer (106);
removing the first and second dummy gates in order to make first and second grooves (23, 33) in said encapsulation layer (106);
simultaneously depositing a gate insulating layer (107) at least in the bottom of the first groove and on a side wall of the second groove;
forming a gate electrode of said transistor (2) in the first groove, forming source and drain electrodes of said transistor on either side of said gate electrode, forming first and second electrodes of said memory cell on either side of said gate insulating layer deposited on a side wall of the second groove.

14 Claims, 16 Drawing Sheets

(51) Int. Cl.
| | |
|---|---|
| *H01L 29/00* | (2006.01) |
| *H01L 45/00* | (2006.01) |
| *H01L 27/24* | (2006.01) |
| *H01L 23/31* | (2006.01) |
| *H01L 29/06* | (2006.01) |
| *H01L 29/51* | (2006.01) |
| *H01L 29/66* | (2006.01) |

(52) U.S. Cl.
CPC ........ *H01L 29/0649* (2013.01); *H01L 29/517* (2013.01); *H01L 29/66545* (2013.01); *H01L 45/08* (2013.01); *H01L 45/1226* (2013.01); *H01L 45/145* (2013.01); *H01L 45/146* (2013.01); *H01L 45/16* (2013.01); *H01L 45/1608* (2013.01)

(58) Field of Classification Search
CPC ............. H01L 27/11206; H01L 29/517; H01L 29/66545; H01L 29/0649; H01L 45/145; H01L 45/16; H01L 45/1226
See application file for complete search history.

(56) References Cited

U.S. PATENT DOCUMENTS

| | | |
|---|---|---|
| 2012/0012944 A1 | 1/2012 | Yi |
| 2016/0043138 A1 | 2/2016 | Yi |

OTHER PUBLICATIONS

I.G. Baek, et al., "Highly Scalable Non-volatile Resistive Memory using Simple Binary Oxide Driven by Asymmetric Unipolar Voltage Pulses", IEDM 04-587, IEEE International, 2004, 4 pgs.

Wen Chao Shen, et al., "High-K Metal Gate Contact RRAM (CRRAM) in Pure 28nm CMOS Logic Process", IEEE, IEDM12-745, 2012, 4 pgs.

* cited by examiner

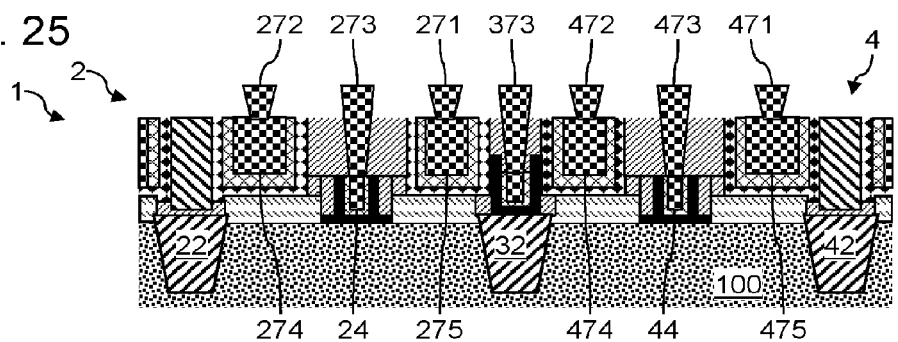
Fig. 25
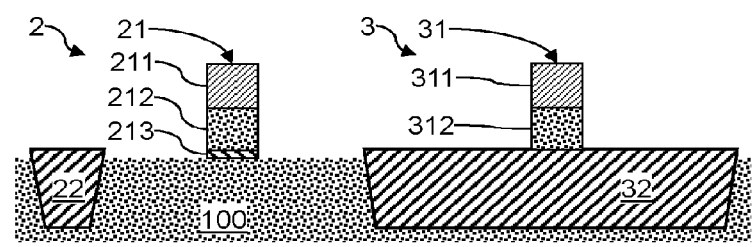
Fig. 26
Fig. 27
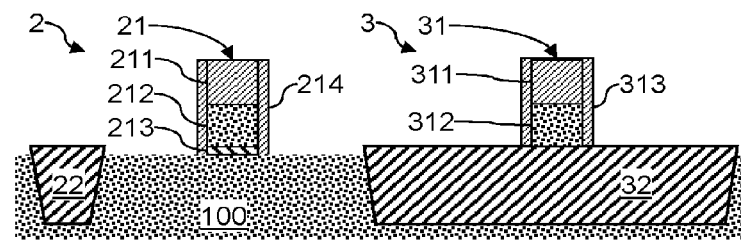
Fig. 28
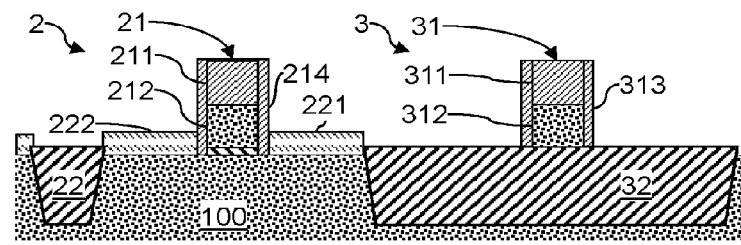
Fig. 29

PROCESS FOR FABRICATING AN INTEGRATED CIRCUIT COINTEGRATING A FET TRANSISTOR AND AN OXRAM MEMORY LOCATION

The invention relates to OxRAM memories, and in particular the cointegration of such memories with field-effect transistors.

In order to overcome the limits in terms of miniaturization, power consumption and complexity of fabricating floating-gate non-volatile memory technologies, the semiconductor industry is developing various alternative technologies. Among the alternative non-volatile memory technologies in the process of being developed, RRAM memories have a certain technical advantage. RRAM memories are based on the reversible formation and breaking of a conductive filament: a dielectric material, which is normally insulating, may be forced to be conductive through a filament or conduction path after application of a sufficiently high voltage. Once the filament is formed, it may be re-initialized or programmed by an appropriately applied voltage.

In the particular case of OxRAM memories, the conductive filament is produced from oxygen vacancies in an insulating metal-oxide-based material. OxRAM memories benefit from a very good thermal stability, in theory making it possible to keep the information in a reliable manner for several years at high temperature.

An OxRAM memory cell may be produced from a basic memory location or memory point according to three known solutions.

In a first approach, which is the simplest, the memory location may be used as a basic memory cell, and used in a configuration in which parallel bit lines are crossed by perpendicular word lines, with the switching material placed between the word line and bit line at each cross point. This configuration is called a cross-point cell. Given that this architecture may result in a large parasitic current flowing through non-selected memory cells from the neighbouring cells, the cross-point array may have a very slow read access.

In a second approach, a selection element may be added in order to eliminate this parasitic current, but this selection element induces excessive power consumption.

In a third approach, a field-effect transistor is added, facilitating the selection of a memory location and thus optimizing the access time, while limiting the current passing through the cell, thus preventing transient state overcurrents that may impair or even destroy the cell.

In this third approach, the integration density is however greatly impaired, the selection transistors occupying a sizeable surface of the substrate of the integrated circuit.

The document 'Highly Scalable Non-volatile Resistive Memory using Simple Binary Oxide Driven by Asymmetric Unipolar Voltage Pulses' by I. G. Baek et alia, published by the IEEE in 2004, describes an example of cointegration of OxRAM memory cells with selection transistors. With a view to improving the integration density of the integrated circuit, this document proposes to integrate the selection transistors into a pre-metallization layer or FEOL layer, and to integrate the OxRAM memory locations into a post-metallization layer or BEOL layer, directly above or plumb with the selection transistors.

In practice, such a cointegration does not make it possible to increase the integration density as much as desired, while involving a substantially increased complexity of the fabrication process.

Document US 2012/012944 describes a structure cointegrating RRAM memories and transistors. The gate insulator of the transistors is used to form conductive filaments of RRAM memories.

The invention aims to solve one or more of these drawbacks. The invention thus relates to a process for fabricating an integrated circuit that includes at least one field-effect transistor and a memory cell of OxRAM type, as defined in Claim 1.

The invention also relates to the variants defined in the dependent claims. A person skilled in the art will understand that each of the features of the dependent claims may be combined independently with the features of Claim 1, without actually constituting an intermediate generalization.

The invention also relates to an integrated circuit, as defined in the appended claims.

Other features and advantages of the invention will become clearly apparent from the description thereof given below by way of completely nonlimiting indication, and with reference to the appended drawings, in which:

FIG. 25 is a cross-sectional view of a variant of an integrated circuit according to the invention;

FIG. 26 illustrates a schematic sectional view of various successive materials used in an OxRAM cell according to the invention;

FIGS. 27 to 48 are cross-sectional views during various steps of a second embodiment of a process for fabricating an integrated circuit according to the invention;

Figure 49:
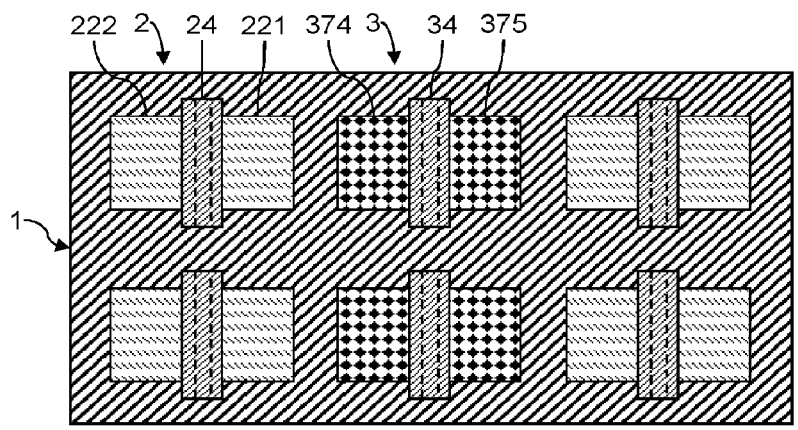
Figure 50:
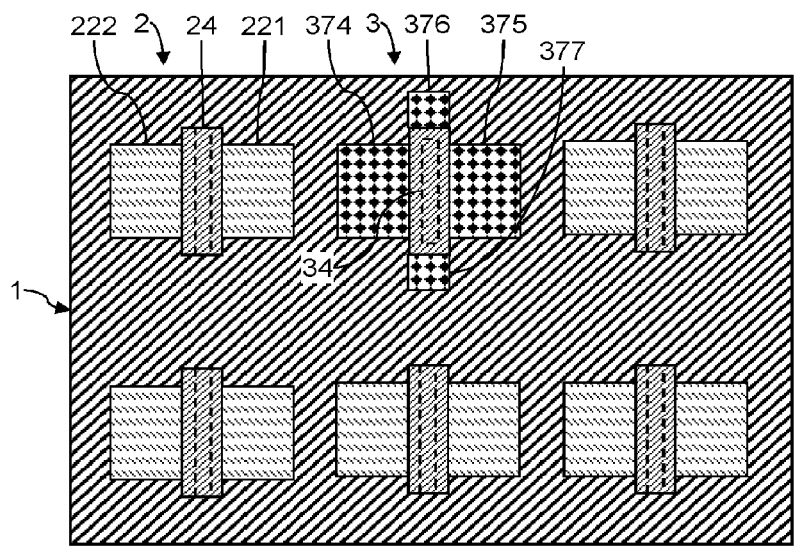
Figure 51:
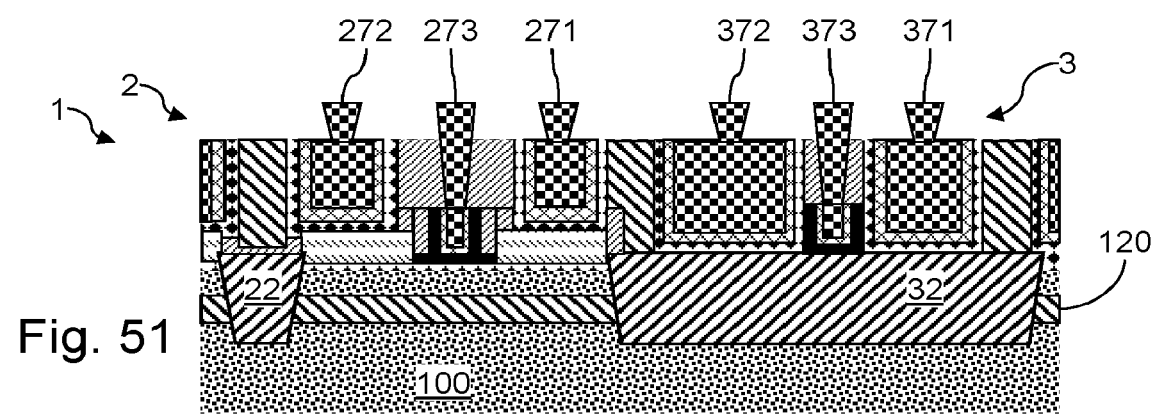
Figure 52:
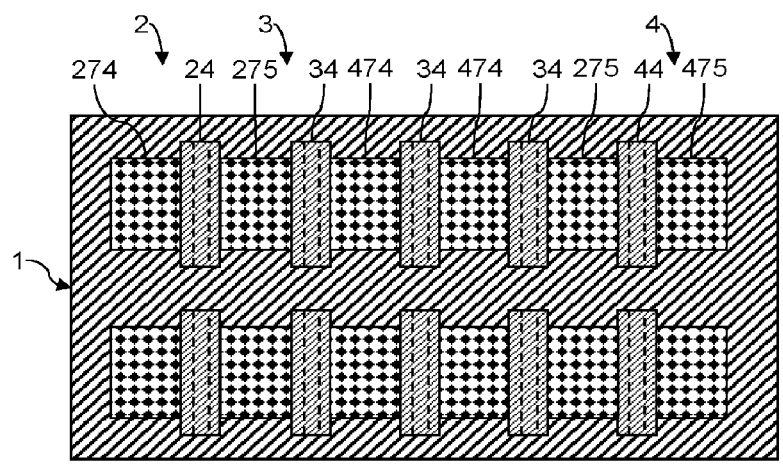
Figure 53:
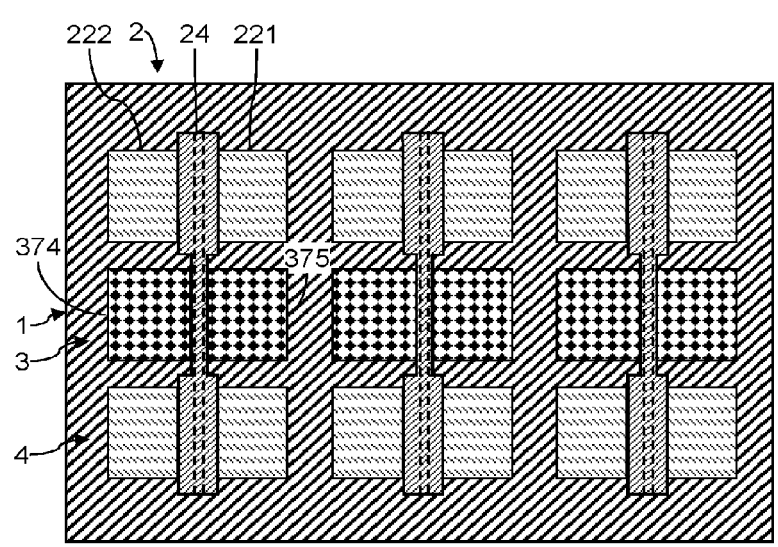
Figure 54:
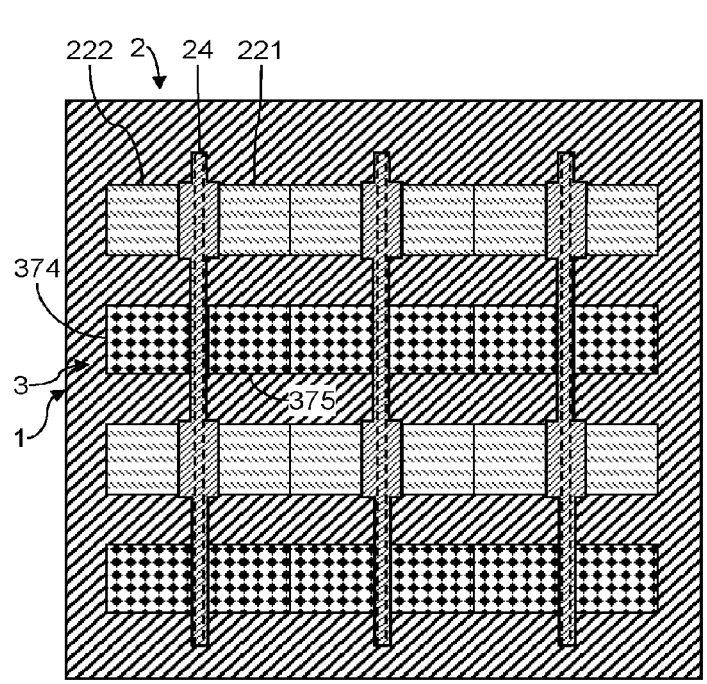

FIGS. 49 and 50 schematically illustrate top views of various configurations of an integrated circuit according to the invention;

FIG. 51 schematically illustrates a sectional view of a variant of an integrated circuit according to the invention;

FIGS. 52 to 54 schematically illustrate top views of other configurations of an integrated circuit according to the invention.

The invention proposes to cointegrate OxRAM memory cells and their selection transistors in a same pre-metallization layer, from the same materials, formed during common deposition steps.

Figure 1:
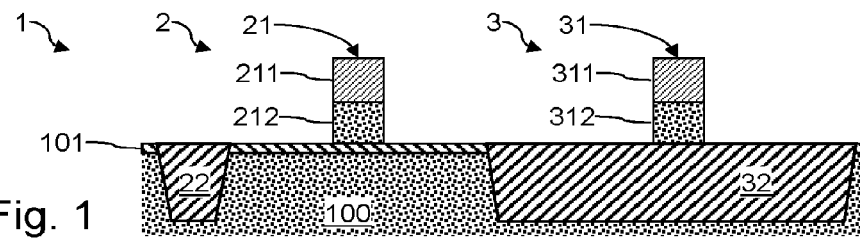
FIGS. 1 to 24 are cross-sectional views during various steps of a first embodiment of a process for fabricating an integrated circuit according to the invention.

FIG. 1 is a cross-sectional view of an integrated circuit 1 at the start of a fabrication process according to a first embodiment of the invention. At the start of this fabrication process, a semiconductor substrate 100, typically a semiconductor substrate made of silicon with residual p-type doping, is provided. In the example illustrated, the substrate 100 is of bulk type.

Isolation trenches 22 and 32 are formed in the substrate 100. The isolation trenches 22 and 32 may have a depth that is known per se. The isolation trenches 22 and 32 may be made in a manner known per se from a material such as silicon oxide. The semiconductor substrate 100 is covered with an etch-stop layer 101. The etch-stop layer 101 is here formed from an electrically insulating material. The etch-stop layer 101 is for example made from the same material as the isolation trenches 22 and 32, for example made of silicon oxide. The etch-stop layer 101 has for example a thickness of between 2 and 6 nm.

A dummy gate 21 of a transistor 2 is positioned on the stop layer 101, between the isolation trenches 22 and 32. The dummy gate 21 may advantageously have a thickness of between 50 and 150 nm, and preferably of the order of 100 nm. The dummy gate 21 here comprises a semiconductor element 212 formed on the stop layer 101. The semiconductor element 212 may be formed of silicon. The semiconductor element 212 may be formed from the same material as the substrate 100 or a same material with a different crystallographic structure. The semiconductor element 212 may also be formed of polysilicon. The semiconductor element 212 is for example produced with a thickness of between 30 and 90 nm, and advantageously of 70 nm. The dummy gate 21 here comprises an insulating element 211, formed on the semiconductor element 212. The insulating element 211 is typically made from a masking material, for example silicon nitride. The insulating element 211 is for example produced with a thickness of between 20 and 60 nm, and advantageously of 30 nm.

A dummy gate 31 of a memory location 3 is here advantageously positioned on the isolation trench 32. The dummy gate 31 here comprises a semiconductor element 312 formed on the isolation trench 32. The semiconductor element 312 is for example formed from the same material as the semiconductor element 212 and may have the same thickness as the semiconductor element 212. The dummy gate 31 here comprises an insulating element 311, formed on the semiconductor element 312. The insulating element 311 is typically formed from the same material as the insulating element 211 and may have the same thickness as the insulating element 211.

The use of dummy gates is employed in gate-last processes. The dummy gates 21 and 31 may have a geometry defined in a manner known per se by prior photolithography and selective etching steps. The stop layer 101 and the isolation trenches 22 and 32 make it possible for example to carry out etchings that delimit the dummy gates 21 and 31, without etching into the semiconductor substrate 100. The insulator thicknesses 211 and 311 may for example be deposited beforehand by a deposition of PECVD (plasma-enhanced chemical vapour deposition) type.

Figure 2:
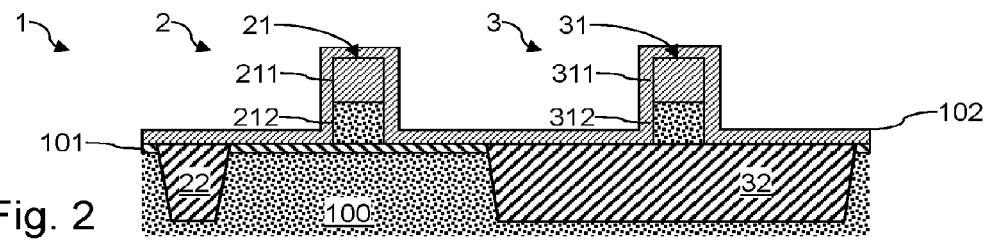

At the stage illustrated in FIG. 2, a layer 102 of insulating material is deposited so as to form spacers on either side of the dummy gates 21 and 31. The layer 102 is for example blanket-deposited, for example by an ALD (atomic layer deposition) process. The layer 102 may be made from a material such as silicon nitride, or from materials of low-K type such as SiCBN or SiOCN. The thickness of the spacers formed on either side of the dummy gates 21 and 31 is for example between 4 and 8 nm, typically 6 nm.

Figure 3:
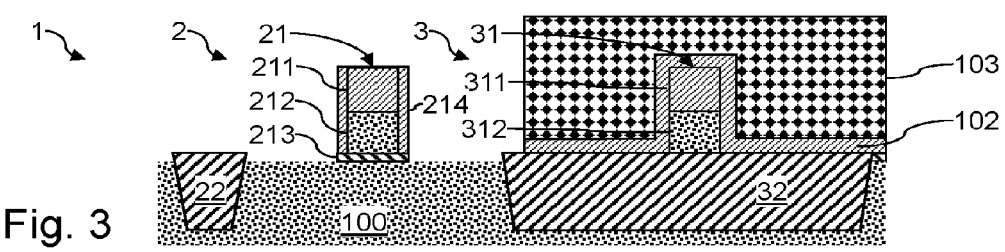

At the stage illustrated in FIG. 3, a masking 103 was defined in order to cover the dummy gate 31 and a portion of the layer 102 on either side of the dummy gate 31. The masking 103 was removed by photolithography between the isolation trenches 22 and 32, and was in particular removed from the dummy gate 21. The masking 103 was thus only retained over the zones of the memory locations 3. By etching, the layer 102 on either side of the dummy gate 21 was removed, advantageously by an anisotropic etching that thus makes it possible to produce spacers. By etching, the stop layer 101 on either side of the dummy gate 21 was also removed, for example by oxide attack. The semiconductor of the substrate 100 is thus exposed on either side of the dummy gate 21. At the end of these etchings, a portion 213 of the stop layer is retained under the element 212 and spacers 214 are retained on either side of the elements 211 and 212 of the dummy gate 21.

Figure 4:
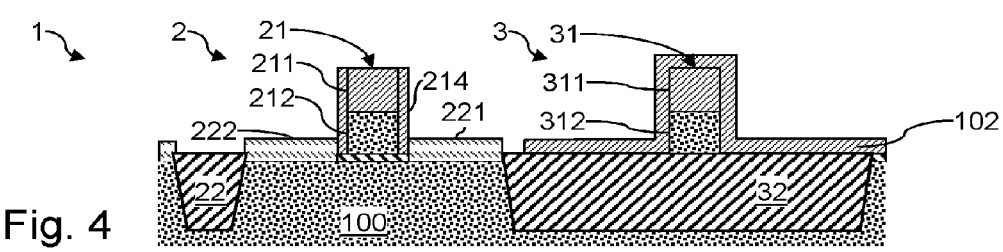

At the stage illustrated in FIG. 4, the masking 103 is removed in a manner known per se, so as to expose the layer 102 remaining in the zone of the memory location 3. Semiconductor elements 222 and 221 are advantageously formed on either side of the dummy gate 21, on the semiconductor of the substrate 100, between the isolation trenches 22 and 32. The semiconductor elements 222 and 221 are typically formed over a thickness advantageously of between 10 nm and 30 nm. The semiconductor elements 222 and 221 are typically formed by epitaxy on the semiconductor of the substrate 100. The elements 222 and 221 are typically obtained by selective epitaxial growth of silicon on crystalline silicon of the substrate 100. They may also be obtained by selective growth of SiGe. The elements 221 and 222 may be subjected to a doping via a subsequent implantation step, not explained in detail here, or else via an in situ doping during the epitaxy step. Prior to the epitaxy step, a recess is advantageously made in the material of the substrate 100, for example in order to place the channel of a bulk substrate 100 under stress.

Figure 5:
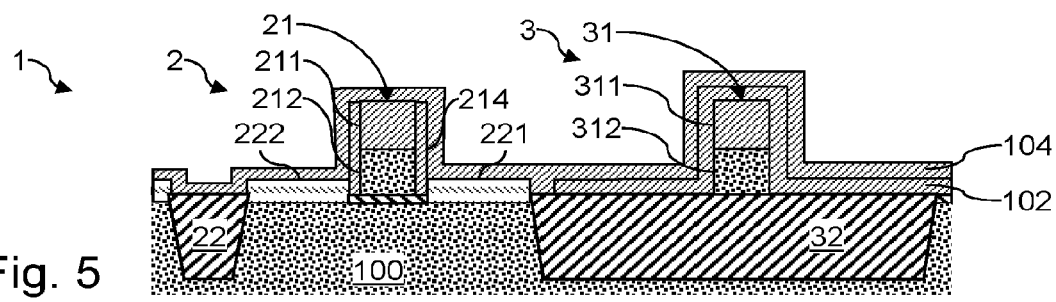

At the stage illustrated in FIG. 5, a stop layer 104 was deposited in order to cover the zone of the transistor 2. The stop layer 104 in particular covers the zone between the isolation trenches 22 and 32 and the dummy gate 21. The stop layer 104 is for example formed by a blanket deposition of an insulator so as to cover the dummy gate 31. The stop layer 104 is for example formed by a deposition of nitride (for example of CESL (contact etch stop layer) type). The stop layer 104 is for example deposited over a thickness of around 6 nm.

Figure 6:
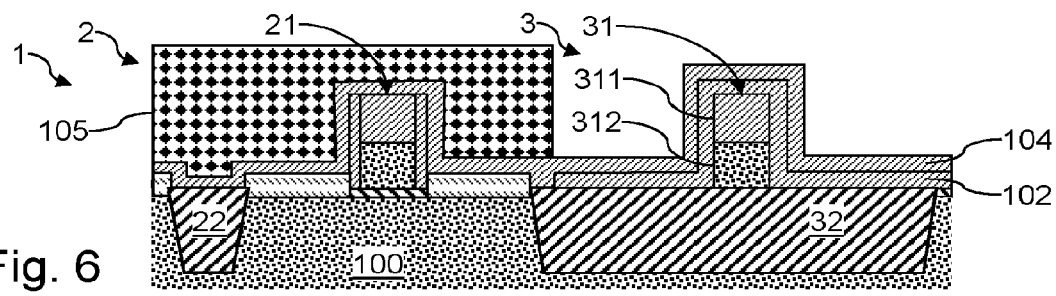

At the stage illustrated in FIG. 6, a masking 105 was defined in order to cover the dummy gate 21 and the layer 104 between the isolation trenches 22 and 32. The masking 105 was obtained by photolithography in order to expose the zones of the memory locations 3. The masking 105 was thus only retained over the zones of the transistor 2.

Figure 7:
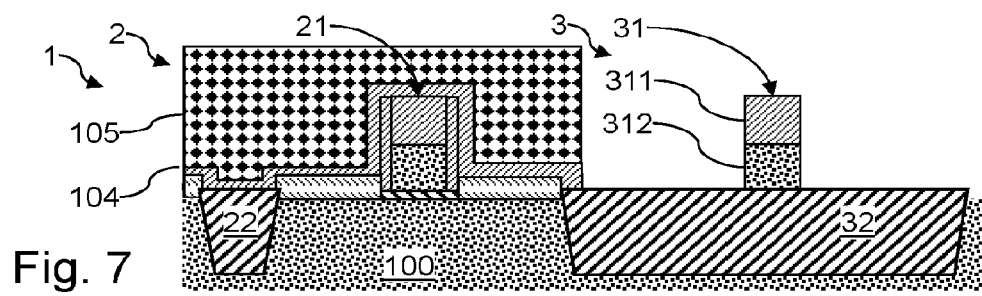

At the stage illustrated in FIG. 7, the layers 102 and 104 on either side of the dummy gate 31 were removed by etching, for example by isotropic etching. The isolation trench 32 is thus exposed on either side of the dummy gate 31. The spacers are removed on either side of the dummy gate 31, simultaneously during the use of isotropic etching.

Figure 8:
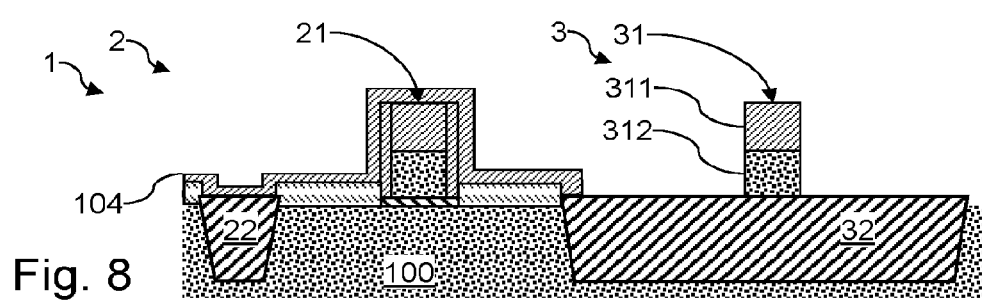

At the stage illustrated in FIG. 8, the masking 105 is removed in a manner known per se, so as to expose the stop layer 104 remaining in the zone of the transistor 2.

Figure 9:
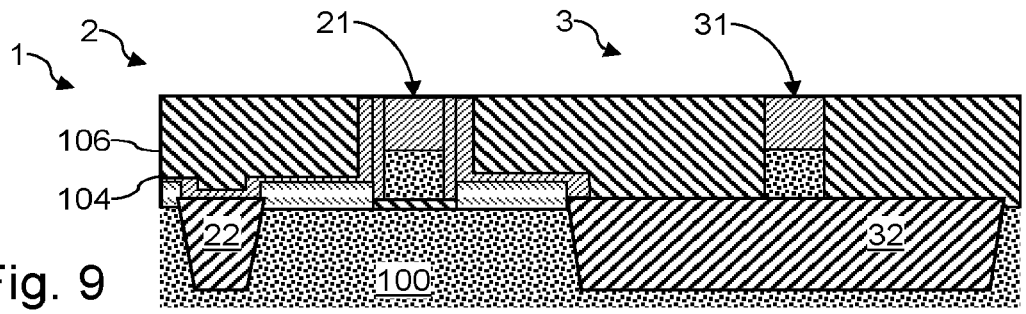

At the stage illustrated in FIG. 9, encapsulation of the integrated circuit 1 in an insulating layer 106 was carried out. The encapsulation is typically carried out in a blanket manner using a silicon oxide. A chemical mechanical polishing was then carried out here and was interrupted after having reached the elements 211 and 311. These elements 211 and 311 act as stop layer for the chemical mechanical polishing.

Figure 10:
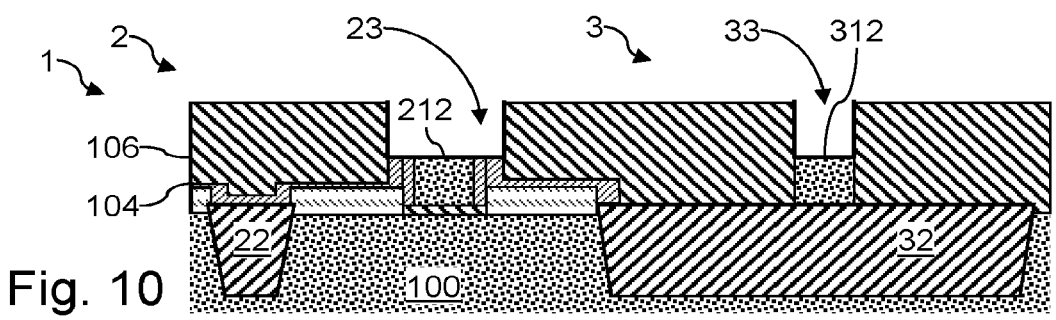

At the stage illustrated in FIG. 10, the elements 211 and 311 were removed until the semiconductor elements 212 and 312 were respectively reached. Grooves 23 and 33 are thus formed in the insulating layer 106. The removal of the silicon nitride until the elements 212 and 312 are reached is for example carried out by wet chemical etching with $H_3PO_4$ at high temperature (for example between 150 and 160° C.). Such etching is particularly selective with respect to the silicon of the elements 212 and 312 and to the silicon oxide of the layer 106 for example.

Figure 11:
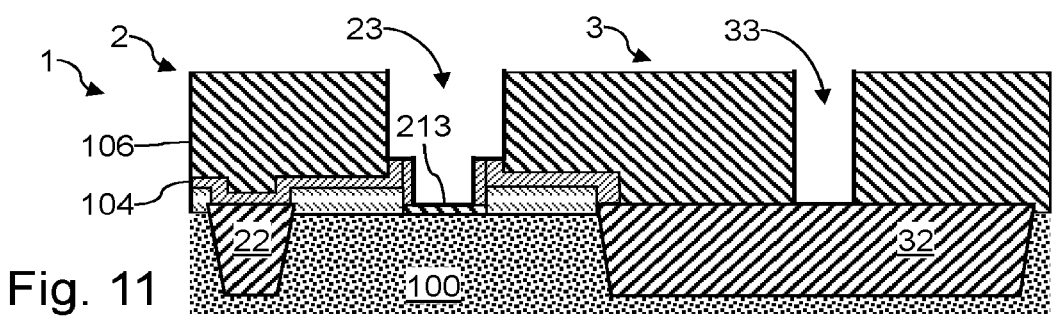

At the stage illustrated in FIG. 11, the elements 212 and 312 were removed. The grooves 23 and 33 then respectively reach the portion of stop layer 213 and the deep isolation trench 32. The elements 212 and 312 may for example be removed by chemical etching with TMAH (tetramethylammonium hydroxide) or $NH_4OH$.

Figure 12:
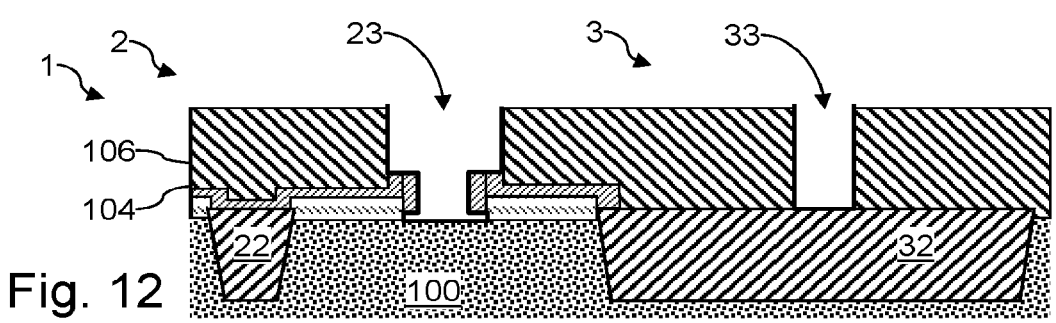

At the stage illustrated in FIG. 12, the portion of stop layer 213 was removed. The groove 23 then reaches the substrate 100. This removal is for example carried out by chemical etching with hydrofluoric acid. Such chemical etching makes it possible in addition to prepare the surface of the substrate 100 for a subsequent deposition step. A surface portion of the deep isolation trench 32 is also etched.

Figure 13:
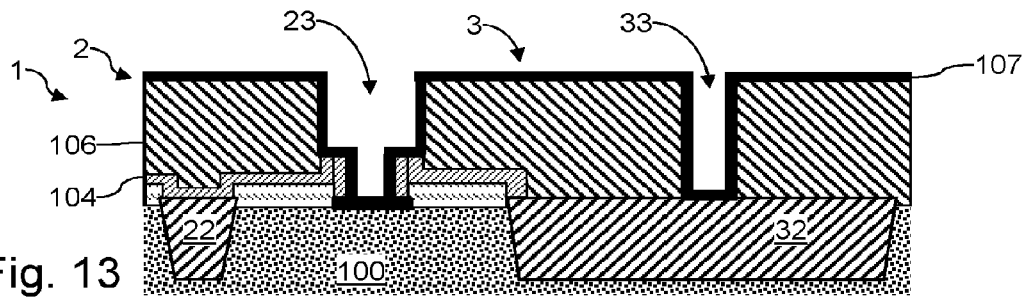

At the stage illustrated in FIG. 13, an insulating layer 107 was formed that covers the zone of the transistor 2 and the zone of the memory location 3. The insulating layer 107 here covers the upper face of the layer 106, the side walls of the grooves 23 and 33, and respectively the substrate 100 and the isolation trench 32 at the bottom of the grooves 23 and 33. The grooves 23 and 33 are not completely filled by the insulating layer 107. The insulating layer 107 is here formed by a blanket deposition. The insulating layer 107 may for example be deposited by an ALD-type process, which makes it possible to obtain a homogeneous thickness on the vertical faces and the horizontal faces.

The material chosen for the insulating layer 107 is a material that is compatible both for forming a gate insulator for the transistor 2 and for forming the insulator of the conductive filament of the memory location 3. The material of the insulating layer 107 may for example be of Hk or high-K type (a high-K material usually denotes a material from which the relative dielectric constant is at least equal to 6). The material of the insulating layer 107 may for example be $HfO_2$, a common material for producing a gate isolator. Other materials may be used for the insulating layer 107, including, non-limitingly, HfSiON or HfAlO (favourable to the performance of the memory location 3).

For $HfO_2$, it is possible for example to envisage a thickness of 10 nm of the insulating layer 107 for a potential difference of 3 V, or a thickness of 3 nm for a potential difference of at most 1 V.

The layer 107 will have a thickness and a material that are suitable, in a manner known per se, for enabling the formation of a conductive filament of an OxRAM memory cell. The thickness of the layer 107 deposited on the substrate 100 characterizes the thickness of the gate insulator of the transistor 2. The thickness of the layer 107 deposited on the side walls of the groove 33 characterizes the thickness of the conductive filament of the OxRAM memory cell. A layer 107 made of $HfO_2$ will preferably have a thickness of between 1 and 10 nm (and preferably of between 3 and 5 nm).

Figure 14:
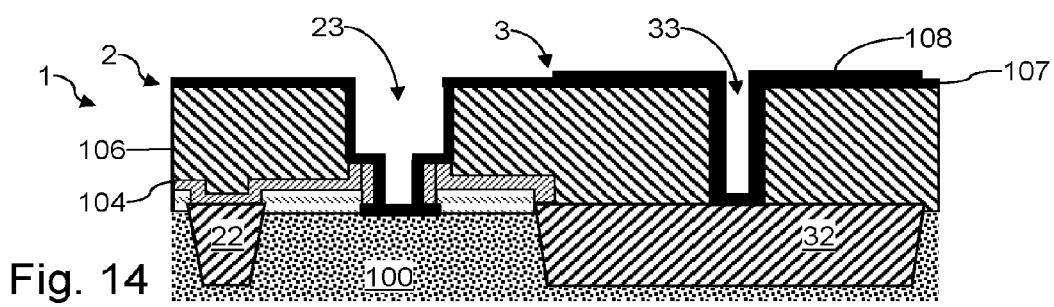

FIG. 14 illustrates a variant of the fabrication process, in which the thickness of the insulating layer 107 formed is greater at the memory location 3 compared to the transistor 2. The process for forming the insulating layer 107 according to this variant may comprise a first step of blanket deposition of insulating material with a first thickness t1. During a second step, the zone of the memory location 3 is masked and the deposit of insulator is removed by etching in the zone of the transistor 2. After removal of the masking from the memory location 3, the memory location 3 remains covered by an insulating layer having a thickness t1. During a third step, a blanket deposition of insulating material with a thickness t2 is carried out. The insulating layer 107 formed then has a thickness t2 at the transistor 2, and a thickness t1+t2 at the memory location 3. Since the thickness of the insulating layer 107 is defined in the various zones by blanket deposition steps, it may easily be obtained industrially with a high accuracy.

This variant illustrates the possibility of having different thicknesses of the layer 107 for the transistor 2 or the memory location 3, as a function of their respective size constraints. It is of course also possible to envisage the thickness of the layer 107 for the transistor 2 being greater than that of the memory location 3.

Figure 15:
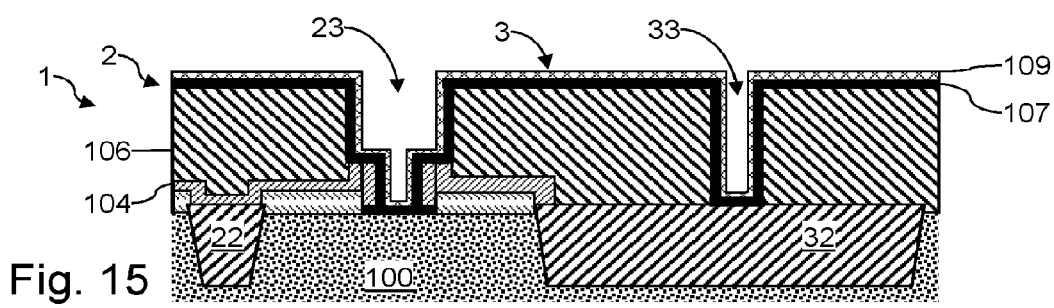

FIG. 15 illustrates the continuation of the fabrication process corresponding to the variant from FIG. 13. At the stage illustrated in FIG. 15, a layer of conductive material 109 was formed on the layer 107. The layer of conductive material 109 formed covers the zone of the transistor 2 and the zone of the memory location 3. The layer of conductive material 109 here covers the upper face of the layer 107 and the side walls of the grooves 23 and 33, and also the bottom of the grooves 23 and 33. The grooves 23 and 33 are not completely filled by the layer 109.

The layer of conductive material 109 is here formed by a blanket deposition. The layer of conductive material 109 may for example be deposited by a PVD (physical vapour deposition) or CVD (chemical vapour deposition) process. Such deposition processes typically make it possible to form a layer 109, the thickness of which on the horizontal faces is greater than that of the vertical faces. The thickness of the deposit of the layer 109 on the lateral faces of the grooves 23 and 33 is for example typically between 3 and 10 nm, and preferably between 3 and 6 nm, in particular for promoting the operation of the memory location 3. It is also possible to envisage an ALD deposition for the layer 109.

The material chosen for the layer 109 may for example be TiN or TaN. This material is for example chosen to have a work function appropriate for the gate of the transistor 2, and to form an electrode of an OxRam memory location 3.

Figure 16:
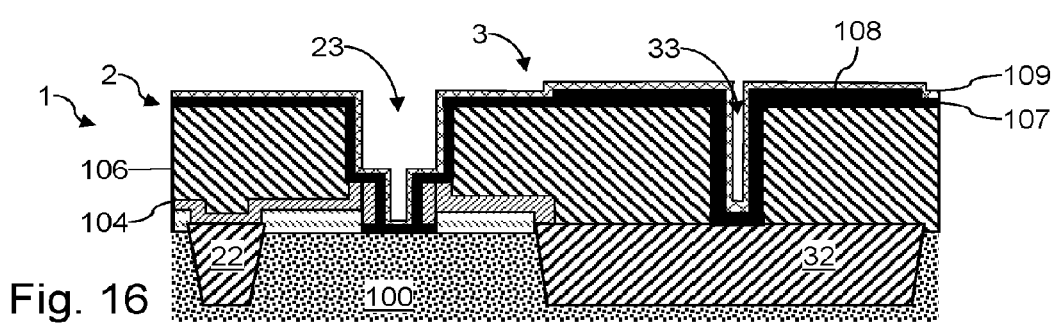

FIG. 16 illustrates the continuation of the fabrication process corresponding to the variant from FIG. 14. The layer of conductive material 109 is here formed on an insulating layer 107 having different thicknesses at the transistor 2 and the memory location 3.

Independently of the process for forming the insulating layer 107, the thickness of the layer of conductive material 109 formed may be different at the transistor 2 and the memory location 3. For example, in order to obtain a thickness of the layer 109 at the memory location 3 that is greater than its thickness at the transistor 2, it is possible to carry out a first step of blanket deposition of conductive material with a thickness (thickness on the vertical faces) t3. During a second step, the zone of the memory location 3 is masked and the deposit of conductive material is removed by etching in the zone of the transistor 2. After removal of the masking of the memory location 3, the memory location 3 remains covered by a layer of conductive material having a thickness t3. During a fourth step, a blanket deposition of the conductive material is carried out with a thickness t4 (thickness on the vertical faces). The layer of conductive material 109 formed then has a thickness t3 at the transistor 2, and a thickness t3+t4 at the memory location 3. Since the thickness of the layer of conductive material 109 is defined in the various zones by blanket deposition steps, it may easily be obtained industrially with a high accuracy. The thickness of the layer of conductive material 109 is advantageously between 2 and 20 nm.

Figure 17:
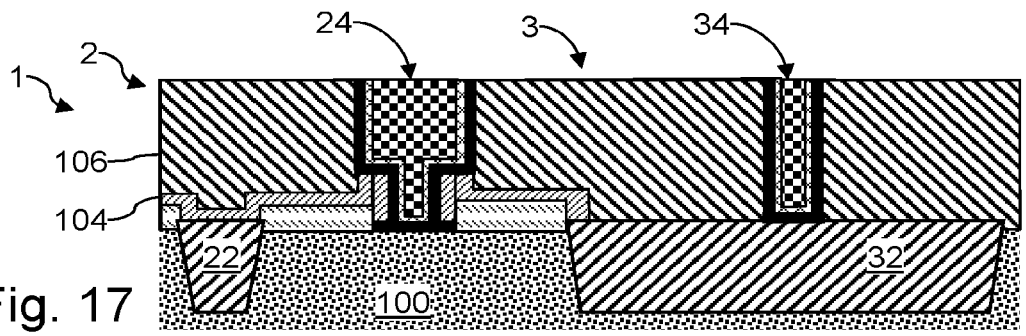

FIG. 17 illustrates the continuation of the fabrication process corresponding to the variant from FIG. 15. At the stage illustrated in FIG. 17, metal was deposited on the layer 109, so as to fill the grooves 23 and 33 with metal pads 24 and 34 respectively. The metal deposited for forming the pads 24 and 34 is typically tungsten. It is also possible to envisage, non-limitingly, forming pads with copper, cobalt or WSi. A chemical mechanical polishing was then carried out and was interrupted after having exposed the layer 106, which then acts as stop layer for the chemical mechanical polishing.

Figure 18:
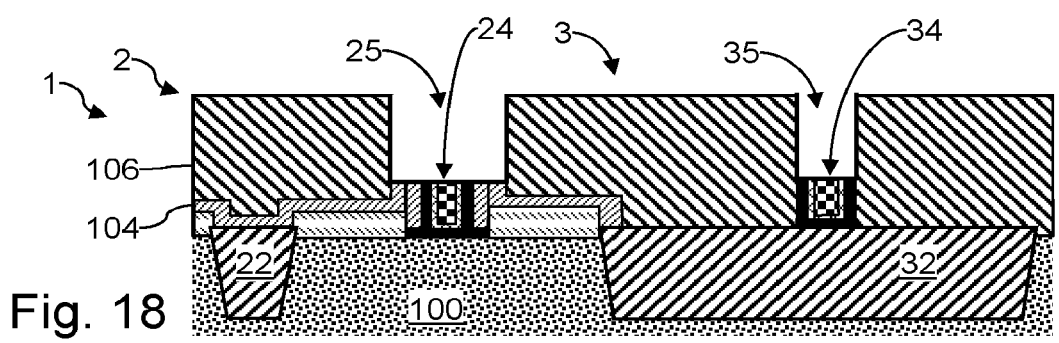

At the stage illustrated in FIG. 18, grooves 25 and 35 were formed in the layer 106. The grooves 25 and 35 are formed respectively by removal of the upper portion of the pads 24 and 34 and removal of the upper portion of the layers 107 and 109. These removals are typically carried out by etching of plasma etching type (RIE for reactive-ion etching, or ICP for inductively coupled plasma). In the case where the trenches 24 and 34 are made of W, etchings based on the following gases: $BCl_3$, $Cl_2$, $SF_6$, Ar, $N_2H_2$, $O_2$ may be envisaged. These removals are interrupted for example at the end of a specified time, so as to form grooves 25 and 35 that are deep enough to form thick enough plugs in a subsequent step. The layer 104 is here exposed at the bottom of the groove 25.

Figure 19:
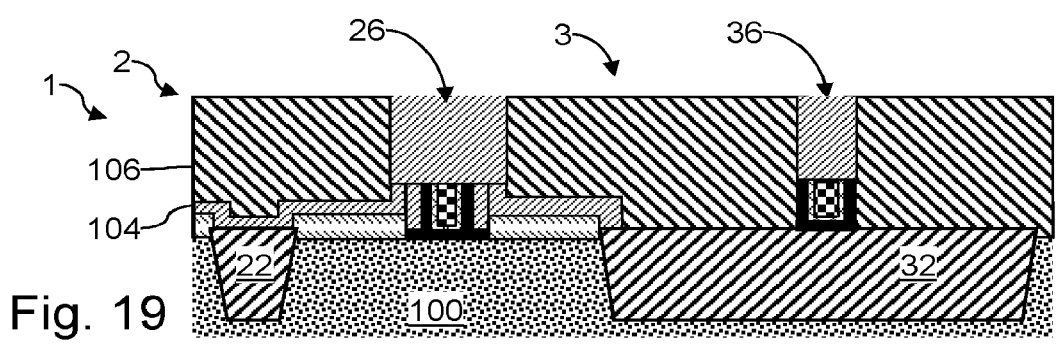

At the stage illustrated in FIG. 19, plugs 26 and 36 were formed that fill the grooves 25 and 35 respectively. The plugs 26 and 36 are typically formed by depositing an insulating material, for example silicon nitride. The formation of the plugs was here followed by a step of chemical mechanical polishing until the upper surface of the layer 106 (which acts as stop layer for the chemical mechanical polishing) was exposed. The plugs 26 and 36 formed act as subsequent protection for the materials that they cover, in particular the gate stack of the transistor 2 and the insulator and an electrode of the memory location 3.

Figure 20:
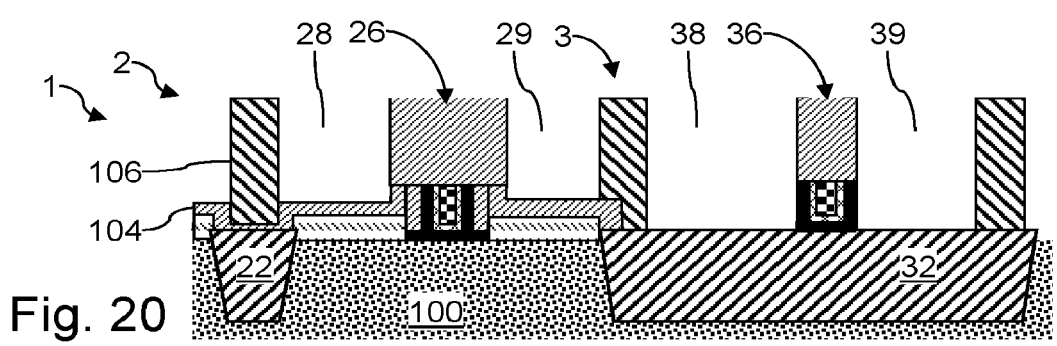

At the stage illustrated in FIG. 20, photolithography was carried out in order to define contact zones on either side of the plugs 26 and 36. Thus, only portions of the layer 106 directly above or plumb with the isolation trenches 22 and 32 are masked. A step of etching the unmasked zones of the layer 106 was then carried out until the layer 104 and the isolation trench 32 on either side of the plugs 26 and 36 were exposed. Grooves 28 and 29 are thus made on either side of the plug 26 and grooves 38 and 39 are made on either side of the plug 36. The etching step is typically carried out selectively with respect to the material of the plugs 26 and 36 (for example by an oxide attack) or carried out anisotropically, so that the etched zones on either side of the plugs 26 and 36 are self-aligned. Such self-alignment (the contacts obtained are usually denoted by SAC for self-aligned contacts) makes it possible to guarantee an optimal compactness of the integrated circuit 1 formed, without being limited by lithography dimensions.

Figure 21:
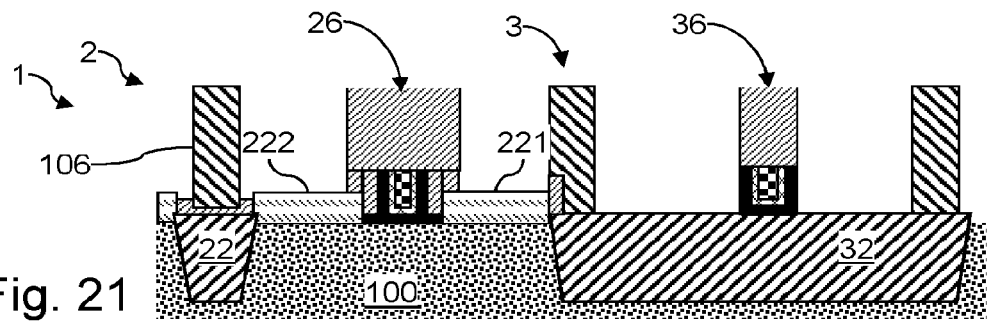

At the stage illustrated in FIG. 21, the layer 104 was removed on either side of the plug 26, until the semiconductor elements 222 and 221 were exposed. The layer 104 is for example removed by anisotropic etching.

Figure 22:
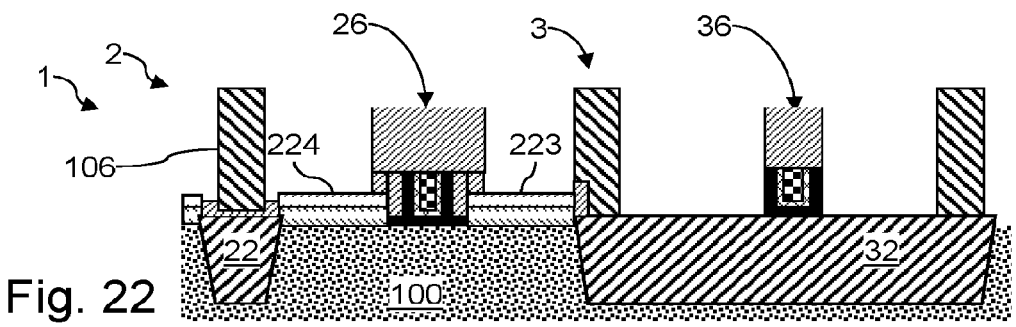

At the stage illustrated in FIG. 22, the silicidation of the semiconductor elements 221 and 222 on either side of the plug 26 was advantageously carried out. The silicidation typically comprises a deposition of metal of Ni or NiPt type for example, an annealing, then a chemical removal of the metal that has not reacted, and generally a new annealing step. Silicided semiconductor elements 223 and 224 are thus formed on either side of the plug 226. The silicidation may be carried out so as to form elements 223 and 224 made of NiSi or NiPtSi for example. Advantageously, the silicidation is carried out over a thickness of from 5 to 15 nm.

Figure 23:
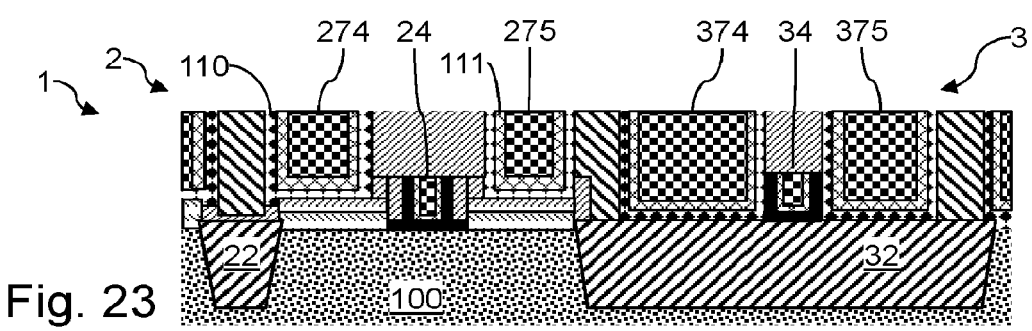

At the stage illustrated in FIG. 23, a metal layer 110 was deposited on the silicided elements 223 and 224, and on the isolation trench 32, and also on the side walls of the grooves 28, 29 and 38, 39 made respectively on either side of the plugs 26 and 36. The metal deposited is typically titanium. Titanium promotes a good attachment to the surfaces on which it is deposited. The thickness of metal deposited on the side walls of the grooves may advantageously be between 2 and 15 nm. The thickness of metal deposited on the bottom of the grooves may advantageously be between 2 and 15 nm. The metal layer 110 is advantageously deposited by a conformal process (of ALD or CVD type).

A conductive metal alloy layer 111 was then deposited on the metal layer 110. The metal alloy layer 111 typically includes TiN. The thickness of the layer 111 deposited on the side walls of the grooves may advantageously be between 3 and 10 nm. The thickness of the layer 111 deposited on the bottom of the grooves may advantageously be between 3 and 10 nm. The layer 111 is advantageously deposited by a conformal (ALD or CVD) process.

Metal was then deposited on the layer 111, so as to fill the grooves with metal pads 274 and 275 on either side of the plug 26, and metal pads 374 and 375 on either side of the plug 36. The metal deposited for forming the pads is typically tungsten. It is also possible to envisage, non-limitingly, aluminium, cobalt, copper, platinum or WSi. Chemical mechanical polishing was then carried out here and was interrupted after having reached the plugs 26 and 36.

The presence of an optional layer of TIN between the metal layer 110 and tungsten pads has the role of a tie layer for the tungsten of the pads and diffusion barrier with respect to fluorine, frequently used as precursor gas during the deposition of tungsten.

Figure 24:
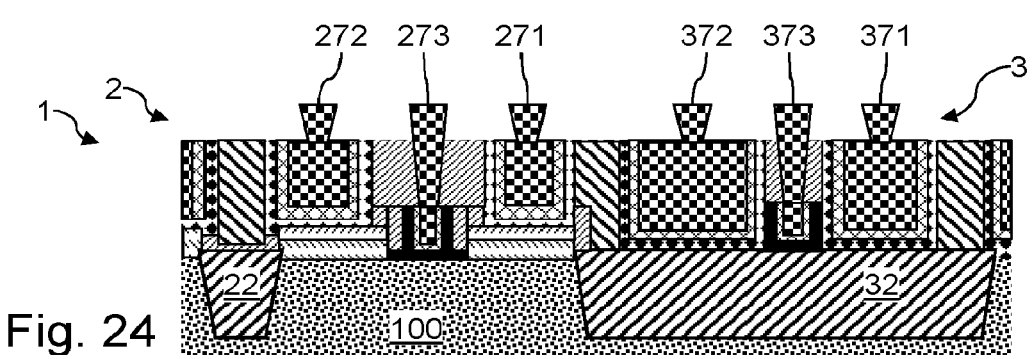

At the stage illustrated in FIG. 24, metal contacts 273, 373, 272, 271, 372, 371 were formed that respectively interconnect with the pads 24, 34, 274, 275, 374, 375. The metal contacts 272, 271 and 273 are respectively in contact with the source, the drain and the gate of the transistor 2.

In practice, the memory location 3 comprises a first memory cell between the pad 34 and the pad 374 on the one hand and another memory cell between the pads 34 and the pads 375.

By having a pad 275 of the transistor 2 separated from the pad 374 of the memory location 3, it is possible to optionally separate the operation thereof and to optionally prevent the operation of one degrading the operation of the other.

FIG. 26 is a schematic sectional view along a plane parallel to the substrate 100, illustrating the succession of layers used for the formation of an OxRAM cell of the memory location 3.

By forming the memory location 3 in the pre-metallization layer, it is possible to benefit from a very reduced pitch available for such a pre-metallization layer, in order to reduce the surface of the substrate 100 covered by the memory location 3. A pitch of 90 nm, or 64 nm may for example be used.

The process is based on a gate-last formation, which makes it possible to form a deposit of insulator on a side wall of a trench, and thus to produce an insulating layer for a horizontal conductive filament.

In a fabrication process according to the invention, a very large number of steps and of materials are common for the formation of the transistor 2 and the formation of the memory location 3. Thus, the fabrication process is substantially simplified and the production cost thereof is particularly reduced.

In the process illustrated, the memory location 3 is advantageously (but not necessarily) formed on an isolation trench in order to take advantage of a portion of integrated circuit necessary for isolating components from one another but that is usually not used very much in a pre-metallization layer. The integration density of the integrated circuit 1 may thus be further increased.

FIG. 25 illustrates a variant of an integrated circuit 1 that may be obtained by a similar fabrication process. This variant aims to increase the integration density of the integrated circuit 1 by using common electrodes for selection transistors 2 and 4 and two memory cells of the memory location 3.

The transistor 2 from FIG. 25 has substantially the same structure as the transistor 2 from FIG. 24. The transistor 4 has substantially the same structure as the transistor 2. The transistor 4 is made between an isolation trench 42 and the isolation trench 32. The transistor 4 comprises a gate metal pad 44, a drain metal pad 474 and a source metal pad 475. The pads 44, 474 and 475 are connected to metal contacts 473, 472 and 471 respectively. The metal contacts 471, 472 and 473 are respectively in contact with the source, the drain and the gate of the transistor 4.

A first cell of the memory location 3 shares a common electrode with the transistor 2, via the pad 275. A second cell of the memory location 3 shares a common electrode with the transistor 4, via the pad 474.

FIG. 27 is a cross-sectional view of an integrated circuit 1 at the start of a fabrication process according to a second embodiment of the invention. At the start of this fabrication process, a semiconductor substrate 100, identical to that from FIG. 1, is provided. Isolation trenches 22 and 32 identical to those from FIG. 1 are formed in the substrate 100.

A dummy gate 21 of a transistor 2 is positioned on the substrate 100, between the isolation trenches 22 and 32. The dummy gate 21 here comprises an insulating portion 213, a semiconductor element 212 formed on the insulating portion 213, and an insulating element 211 formed on the semiconductor element 212. The insulating portion 213 may be made from the same material as the isolation trenches 22 and 32. The insulating portion 213 may for example have a thickness of between 2 and 6 nm. The semiconductor element 212 and insulating element 211 may have the same materials and same thickness as in the example from FIG. 1.

A dummy gate 31 of a memory location 3 is here advantageously positioned on the isolation trench 32. The dummy gate 31 here comprises a semiconductor element 312 formed on the isolation trench 32. The dummy gate 31 may be identical to that described with reference to FIG. 1.

At the stage illustrated in FIG. 28, a layer of insulating material was deposited so as to form spacers 214 and 313 on either side of the dummy gates 21 and 31 respectively. This material may be a material such as silicon nitride, or a material of low-K type such as SiCBN or SiOCN. The thickness of the spacers 214 and 313 formed on either side of the dummy gates 21 and 31 is for example between 5 and 7 nm, typically 6 nm.

The insulating material of the spacers 214 and 313 may be blanket-deposited, for example by an ALD process, subsequently followed by a step of etching (for example anisotropic etching) so as to remove this insulating material from the respective upper surfaces of the substrate 100 and of the isolation trenches 22 and 32.

At the stage illustrated in FIG. 29, semiconductor elements 222 and 221 are advantageously formed on either side of the dummy gate 21, on the semiconductor of the substrate 100, between the isolation trenches 22 and 32. The semiconductor elements 222 and 221 are typically formed over a thickness of from 10 nm to 35 nm. The semiconductor elements 222 and 221 are typically formed by epitaxy on the semiconductor of the substrate 100. The elements 222 and 221 are typically obtained by selective epitaxial growth of silicon on crystalline silicon of the substrate 100. They may also be obtained by selective growth of SiGe. The elements 221 and 222 may be subjected to a doping via a subsequent implantation step, not explained in detail here, or else via an in situ doping during the epitaxy step. Prior to the epitaxy step, a recess is advantageously made in the material of the substrate 100, for example in order to place the channel of a bulk substrate 100 under stress.

Figure 30:
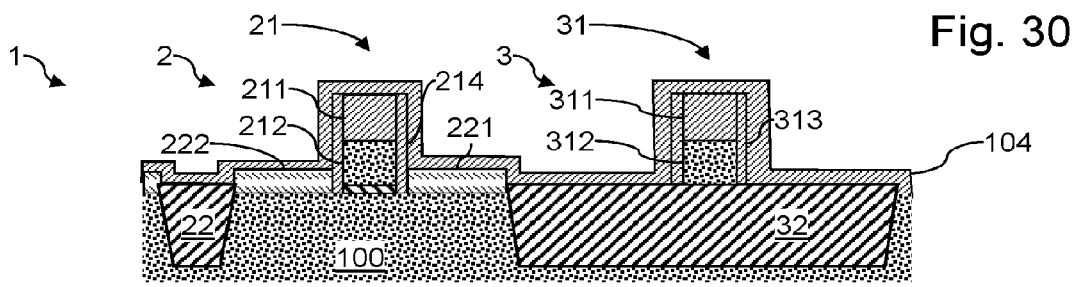

At the stage illustrated in FIG. 30, a layer 104 of insulating material is deposited so as to increase the thickness of the spacers on either side of the dummy gates 21 and 31. The layer 104 is for example blanket-deposited, for example by an ALD (atomic layer deposition) process. The layer 104 may be made from a material such as silicon nitride, or from materials of low-K type such as SiCBN or SiOCN. The total thickness of the spacers obtained after deposition of the layer 104 is advantageously between 5 and 15 nm.

Figure 31:
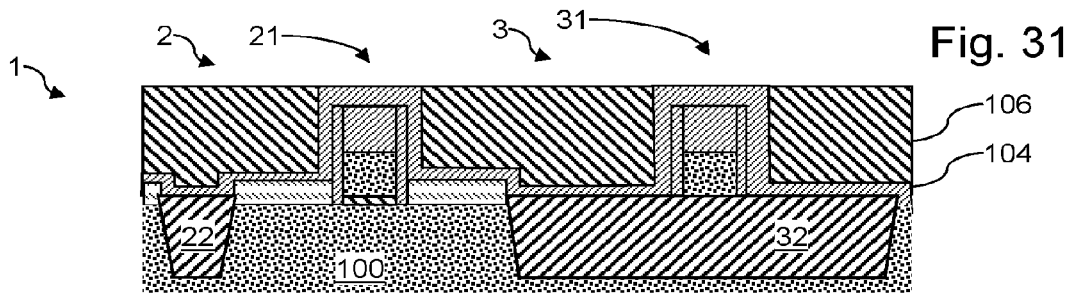

At the stage illustrated in FIG. 31, encapsulation of the integrated circuit 1 in an insulating layer 106 was carried out. The encapsulation is typically carried out in a blanket manner using a silicon oxide. A chemical mechanical polishing was then carried out here and was stopped after having reached the layer 104.

Figure 32:
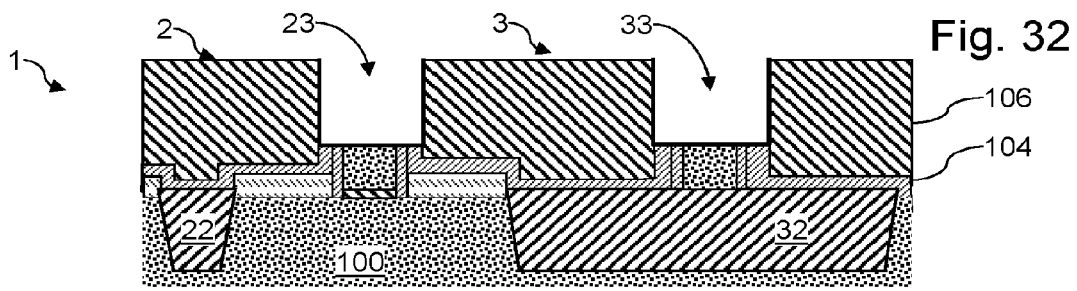

At the stage illustrated in FIG. 32, grooves 23 and 33 were formed in the insulating layer 106, by removal of the elements 211 and 311, the upper portion of the layer 104 and a portion of the spacers 214 and 313, until the semiconductor elements 212 and 312 were respectively reached. A removal of silicon nitride until the elements 212 and 312 are reached is for example carried out by wet chemical etching with $H_3PO_4$ at high temperature (for example between 150 and 160° C.). In the particular case of elements 212 and 312 made of silicon and of a layer 106 made of silicon oxide, such etching proves particularly selective.

Figure 33:
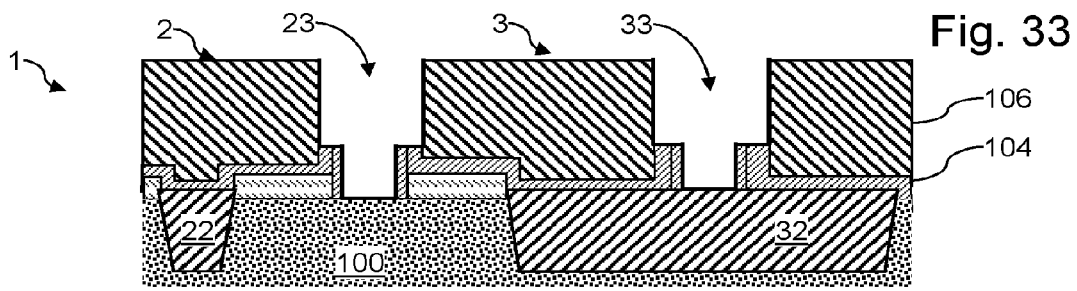

At the stage illustrated in FIG. 33, the elements 212 and 312 were removed. The grooves 23 and 33 then respectively reach the portion of stop layer 213 and the deep isolation trench 32. The elements 212 and 312 may for example be removed by chemical etching with TMAH (tetramethylammonium hydroxide) or $NH_4OH$.

In order to achieve the configuration illustrated in FIG. 33, the insulating portion 213 was removed. The groove 23 then reaches the substrate 100. This removal is for example carried out by chemical etching with hydrofluoric acid. Such chemical etching makes it possible in addition to prepare the surface of the substrate 100 for a subsequent deposition step.

Figure 34:
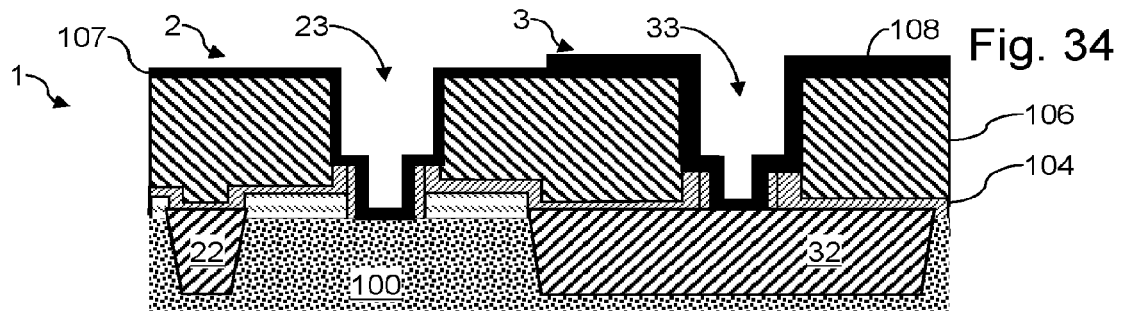

At the stage illustrated in FIG. 34, an insulating layer 107 was formed that covers the zone of the transistor 2 and the zone of the memory location 3. The insulating layer 107 here covers the upper face of the layer 106, the side walls of the grooves 23 and 33, and respectively the substrate 100 and the isolation trench 32 at the bottom of the grooves 23 and 33. The grooves 23 and 33 are not completely filled by the insulating layer 107. The insulating layer 107 is here formed by a blanket deposition. The insulating layer 107 may for example be deposited by an ALD-type process, which makes it possible to obtain a homogeneous thickness on vertical faces and horizontal faces during the same deposition step.

The material chosen for the insulating layer 107 may be identical to that described for the process of the first embodiment, which is compatible both for forming a gate insulator for the transistor 2 and for forming the insulator of the conductive filament of the memory location 3.

The layer 107 will have a thickness and a material that are suitable, in a manner known per se, for enabling the formation of a conductive filament of an OxRAM memory cell. The thickness of the layer 107 deposited on the substrate 100 characterizes the thickness of the gate insulator of the transistor 2. The thickness of the layer 107 deposited on the side walls of the groove 33 characterizes the thickness of the conductive filament of the OxRAM memory cell. A layer 107 made of $HfO_2$ will preferably have a thickness of between 1 and 10 nm (and preferably of between 3 and 5 nm).

FIG. 34 illustrates a variant of the fabrication process, in which the thickness of the insulating layer 107 formed is greater at the memory location 3 compared to the transistor 2. The process for forming the insulating layer 107 according to this variant may comprise a first step of blanket deposition of insulating material with a first thickness t1. During a second step, the zone of the memory location 3 is masked and the deposit of insulator is removed by etching in the zone of the transistor 2. After removal of the masking from the memory location 3, the memory location 3 remains covered by an insulating layer having a thickness t1. During a third step, a blanket deposition of insulating material with a thickness t2 is carried out. The insulating layer 107 formed then has a thickness t2 at the transistor 2, and a thickness t1+t2 at the memory location 3. Since the thickness of the insulating layer 107 is defined in the various zones by blanket deposition steps, it may easily be obtained industrially with a high accuracy.

This variant illustrates the possibility of having different thicknesses of the layer 107 for the transistor 2 or the memory location 3, as a function of their respective size constraints. It is of course also possible to envisage the thickness of the layer 107 for the transistor 2 being greater than that of the memory location 3.

Figure 35:
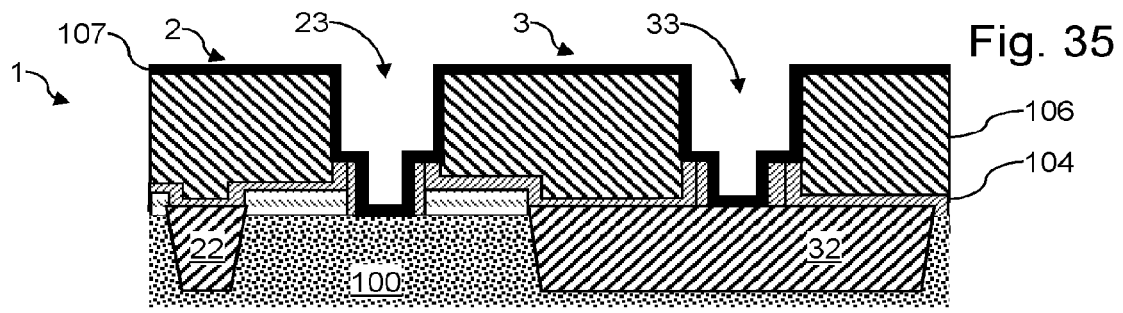

FIG. 35 illustrates a variant of the fabrication process in which the thickness of the insulating layer 107 formed is homogeneous at the memory location 3 and at the transistor 2.

Figure 36:
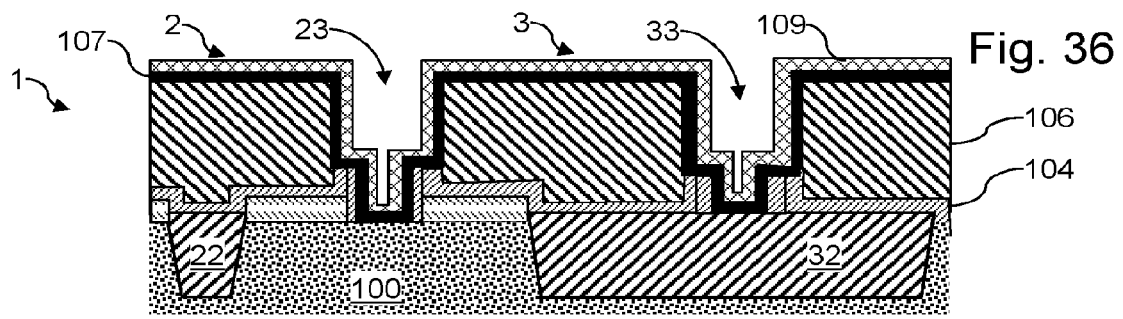

FIG. 36 illustrates the continuation of the fabrication process corresponding to the variant from FIG. 35. At the stage illustrated in FIG. 36, a layer of conductive material 109 was formed on the layer 107. The layer of conductive material 109 formed covers the zone of the transistor 2 and the zone of the memory location 3. The layer of conductive material 109 here covers the upper face of the layer 107 and the side walls of the grooves 23 and 33, and also the bottom of the grooves 23 and 33. The grooves 23 and 33 are not completely filled by the layer 109.

The layer of conductive material 109 is here formed by a blanket deposition. The layer of conductive material 109 may for example be deposited by a PVD (physical vapour deposition) or CVD (chemical vapour deposition) or ALD process. The material and/or the thickness of the layer 109 may be identical to those of the process according to the first embodiment.

Figure 37:
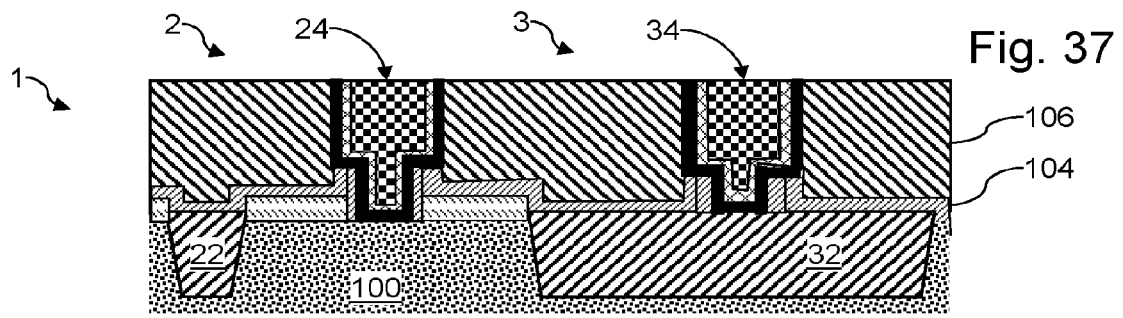

At the stage illustrated in FIG. 37, metal was deposited on the layer 109, so as to fill the grooves 23 and 33 with metal pads 24 and 34 respectively. The metal deposited for forming the pads 24 and 34 may be identical to that described for the process according to the first embodiment. A chemical mechanical polishing was then carried out here and was interrupted after having exposed the layer 106.

Figure 38:
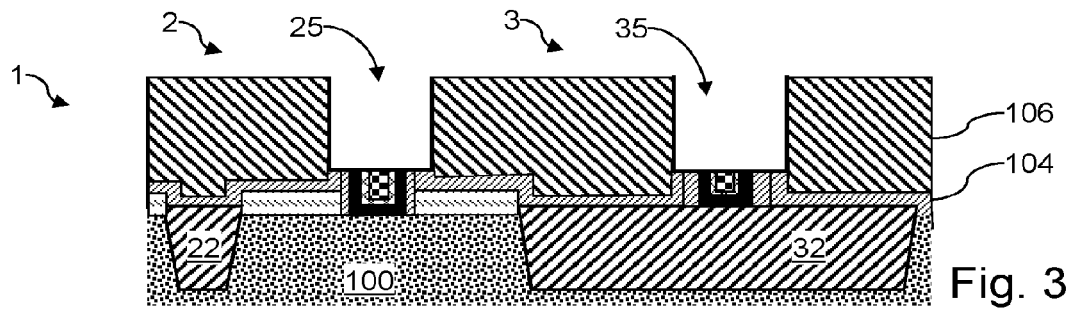

At the stage illustrated in FIG. 38, grooves 25 and 35 were formed in the layer 106. The grooves 25 and 35 are formed respectively by removal of the upper portion of the pads 24 and 34 and removal of the upper portion of the layers 107 and 109. These removals are typically carried out by etching of plasma etching type (RIE for reactive-ion etching, or ICP for inductively coupled plasma). In the case where the trenches 24 and 34 are made of W, etchings based on the following gases: $BCl_3$, $Cl_2$, $O_2$ may be envisaged. These removals are interrupted for example at the end of a specified time, so as to form grooves 25 and 35 that are deep enough to form thick enough plugs in a subsequent step. The layer 104 is then exposed at the bottom of the groove 25.

Figure 39:
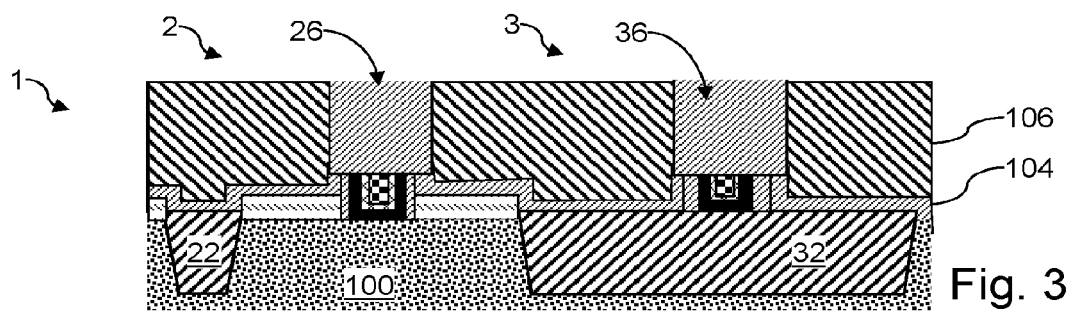

At the stage illustrated in FIG. 39, plugs 26 and 36 were formed that fill the grooves 25 and 35 respectively. The plugs 26 and 36 are typically formed by depositing an insulating material, for example silicon nitride. The formation of the plugs was here followed by a step of chemical mechanical polishing until the upper surface of the layer 106 was exposed. The plugs 26 and 36 formed act as subsequent protection for the materials that they cover, in particular the gate stack of the transistor 2 and the insulator and an electrode of the memory location 3.

Figure 40:
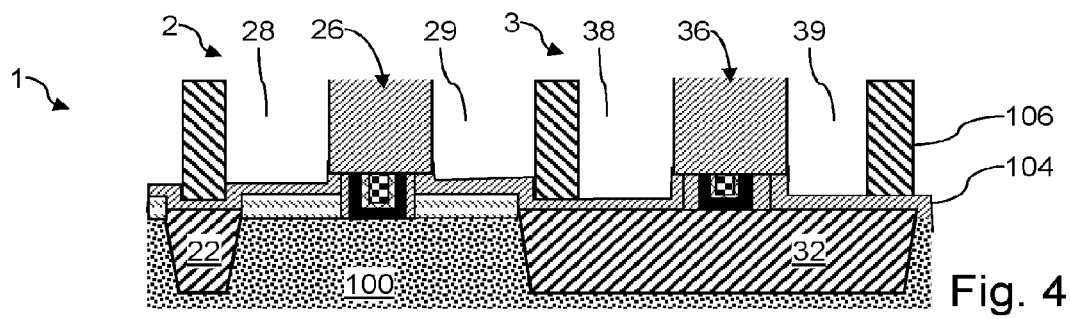

At the stage illustrated in FIG. 40, photolithography was carried out in order to define contact zones on either side of the plugs 26 and 36. Thus, only portions of the layer 106 directly above or plumb with the isolation trenches 22 and 32 are masked. A step of etching the unmasked zones of the layer 106 was then carried out until the layer 104 on either side of the plugs 26 and 36 was exposed. Grooves 28 and 29 are thus made on either side of the plug 26 and grooves 38 and 39 are made on either side of the plug 36. The etching step is typically carried out selectively with respect to the material of the plugs 26 and 36 (for example by an oxide attack), so that the etched zones on either side of the plugs 26 and 36 are self-aligned.

Figure 41:
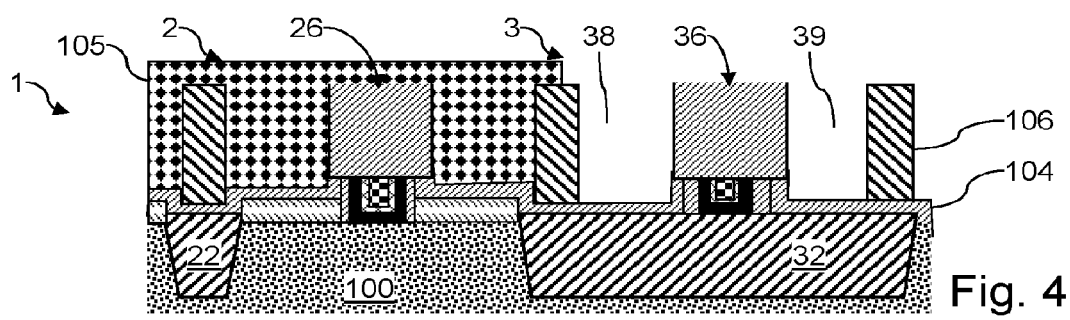

At the stage illustrated in FIG. 41, a masking 105 was defined in order to cover the dummy gate 21 and the layer 104 between the isolation trenches 22 and 32. The masking 105 in particular fills the isolation trenches 28 and 29. The masking 105 was removed by photolithography in order to expose the zones of the memory locations 3. The masking 105 was thus only retained over the zones of the transistor 2.

Figure 42:
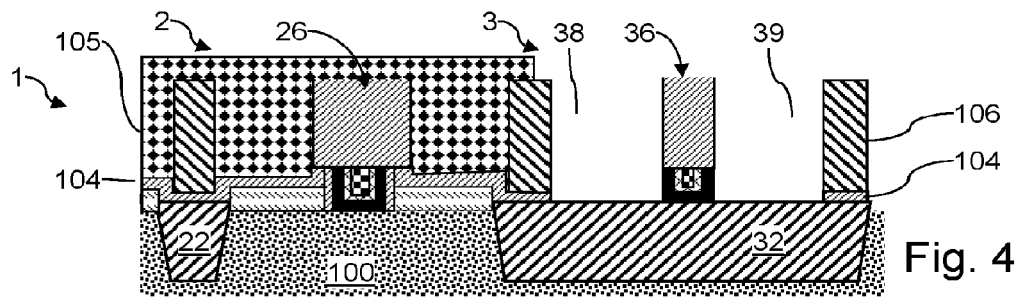

At the stage illustrated in FIG. 42, the layer 104 was removed on either side of the dummy gate 31 and of the plug 36 by etching, for example by anisotropic etching. The isolation trench 32 is thus exposed on either side of the dummy gate 31. The spacers are removed on either side of the dummy gate and of the plug 36.

Figure 43:
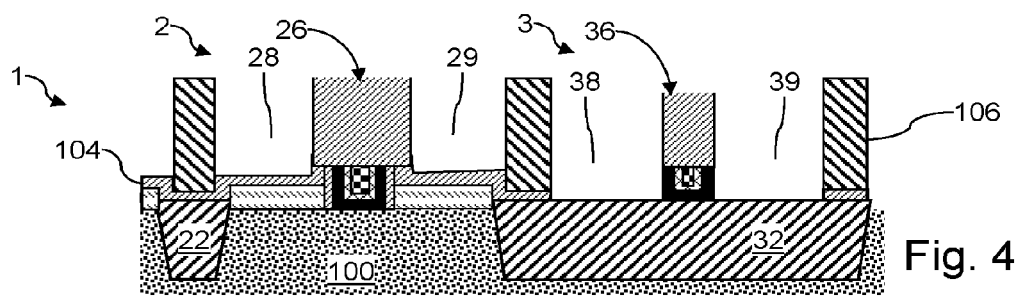

At the stage illustrated in FIG. 43, the masking 105 is removed in a manner known per se, so as to expose the stop layer 104 remaining in the zone of the transistor 2.

According to one variant that is not illustrated, following the stage illustrated in FIG. 40, it is possible to carry out a blanket deposition of insulator, for example of silicon oxide, and for example by an ALD-type process. Via photolithography, it is possible to mask the zone of the transistor 2 and to expose the zone of the memory location 3. An etching of this deposit of insulator in the zone of the memory location 3 may then be carried out until the layer 104 is reached. When the insulating layer deposited is a silicon oxide, the etching may be of reactive-ion etching type. The masking of the zone of the transistor 2 may then be removed. Next, the layer 104 on either side of the dummy gate 31 and of the plug 36 may be removed by etching, for example by etching with orthophosphoric acid. The isolation trench 32 is thus exposed on either side of the dummy gate 31 and of the plug 36. The spacers are removed on either side of the dummy gate and of the plug 36. This step of removal by etching may also be carried out with a mixture of HFEG type (HF=hydrofluoric acid, EG=ethylene glycol), in order to remove both the layer 104 as described above, and to also remove a portion of the silicon oxide deposited beforehand in the zone of the transistor 2.

Figure 44:
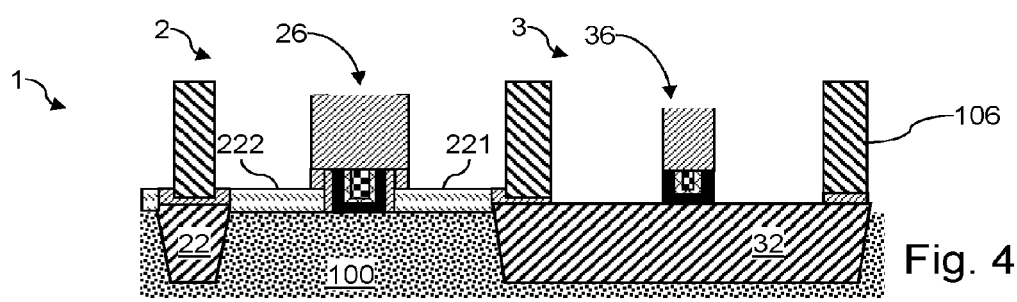

At the stage illustrated in FIG. 44, the layer 104 was removed on either side of the plug 26, until the semiconductor elements 222 and 221 were exposed. The layer 104 is for example removed by anisotropic etching.

Figure 45:
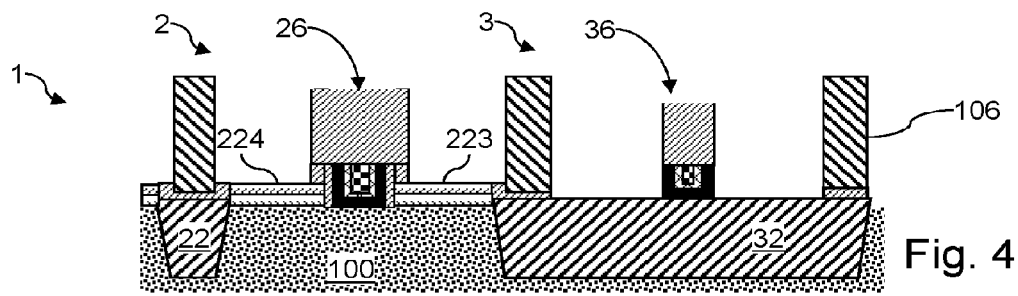

At the stage illustrated in FIG. 45, the silicidation of the semiconductor elements 221 and 222 on either side of the plug 26 was carried out. The silicidation typically comprises a deposition of metal of Ni or NiPt type for example, an annealing, then a chemical removal of the metal that has not reacted, and generally a new annealing step. Silicided semiconductor elements 223 and 224 are thus formed on either side of the plug 226. These elements 223 and 224 may have the same composition as in the first embodiment. Advantageously, the silicidation is carried out over a thickness of from 5 to 15 nm.

Figure 46:
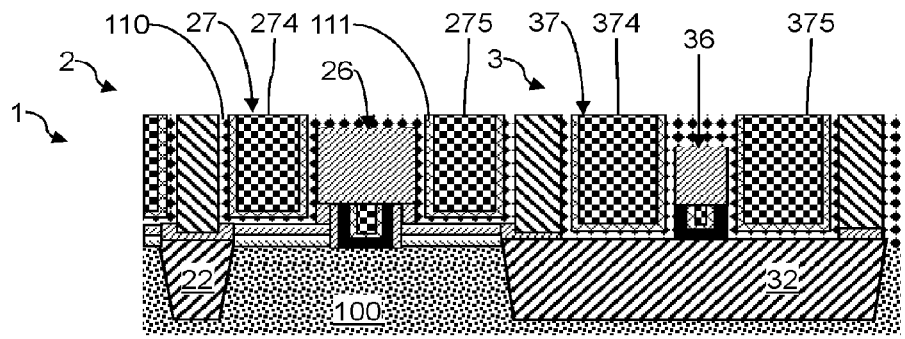

At the stage illustrated in FIG. 46, a metal layer 110 was deposited on the silicided elements 223 and 224, and on the isolation trench 32, and also on the side walls of the grooves 28, 29 and 38, 39 made respectively on either side of the plugs 26 and 36. The metal deposited is typically titanium. The thickness of metal deposited on the side walls of the grooves may advantageously be between 2 and 15 nm. The thickness of metal deposited on the bottom of the grooves may advantageously be between 2 and 15 nm. The metal layer 110 is advantageously deposited by a CVD-type process, in order to have a similar thickness on the horizontal and vertical walls.

A conductive metal alloy layer 111 was then deposited on the metal layer 110. The metal alloy layer 111 typically includes TiN. The thickness of the layer 111 deposited on the side walls of the grooves may advantageously be between 3 and 10 nm. The thickness of the layer 111 deposited on the bottom of the grooves may advantageously be between 3 and 10 nm. The layer 111 is advantageously deposited by a conformal (ALD or CVD) process.

Metal was then deposited on the layer 111, so as to fill the grooves with metal pads 274 and 275 on either side of the plug 26, and metal pads 374 and 375 on either side of the plug 36. The metal deposited for forming the metal pads is typically tungsten. It is also possible to envisage, non-limitingly, aluminium, cobalt, copper, platinum or WSi.

Figure 47:
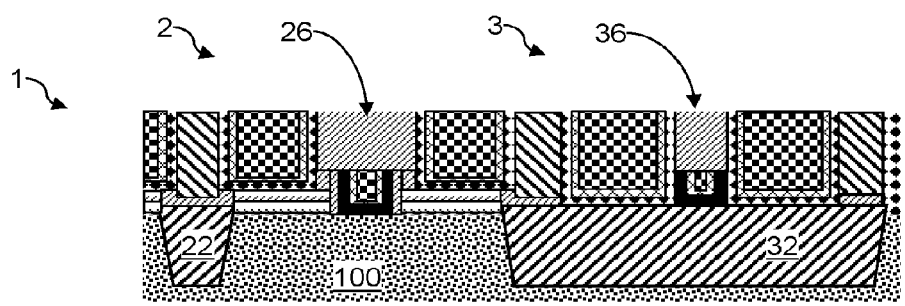

At the stage illustrated in FIG. 47, a chemical mechanical polishing was carried out here and was interrupted after having reached the plugs 26 and 36.

Figure 48:
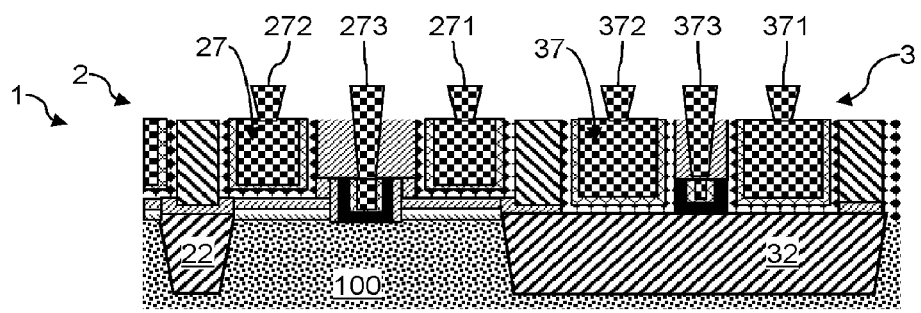

At the stage illustrated in FIG. 48, metal contacts 273, 373, 272, 271, 372, 371 were formed that respectively interconnect with the pads 24, 34, 274, 275, 374, 375. The metal contacts 272, 271 and 273 are respectively in contact with the source, the drain and the gate of the transistor 2.

In practice, the memory location 3 comprises a first memory cell between the pad 34 and the pad 374 on the one hand and another memory cell between the pads 34 and the pads 375.

Although not described in detail, the fabrication process according to the second embodiment may also be used to fabricate transistors and memory cells having electrodes in common, as in the example illustrated in FIG. 25.

As described in detail in the preceding examples, one same memory location 3 makes it possible to delimit two horizontal stacks, for forming two memory cells. FIG. 49 is a partial top view of an example of an integrated circuit 1, illustrating a memory location 3 with two cells formed on either side of a conductive pad 34, and respective selection transistors 2.

The top view illustrated in FIG. 50 represents a variant of an integrated circuit 1 in which the memory location 3 comprises two memory cells on either side of the pad 34 along a first axis, and two memory cells on either side of the pad 34 along a second axis. The memory location 3 thus comprises four memory cells. The pad 34 forms a first electrode common to each of these memory cells, the pads 374 to 377 forming respective connection pads for these memory cells. Each memory cell comprises a respective selection transistor, the connections with these selection transistors not being described in detail.

Although the invention described in the preceding examples is applied to substrates of bulk type, the invention also applies to substrates of silicon-on-insulator type, as in the example illustrated in FIG. 51. A buried insulating layer 120 is integrated into the substrate 100. The buried insulating layer 120 may for example be of UTBOX type. Biased ground planes may be made, in a manner known per se, underneath the UTBOX insulating layer. The integrated circuit 1 may for example be applied for producing transistors of FDSOI type. Whether in bulk or SOI technology, the transistors may be planar or else three-dimensional, with a finFET or tri-gate geometry for example.

Although the invention described in the preceding examples comprises semiconductor elements 221 and 222 formed with epitaxial growth, it is also possible to envisage dispensing with these elements 221 and 222 in order to make the source and drain of the transistor 2 solely in the semiconductor of the substrate 100.

The top view illustrated in FIG. 52 represents a variant of an integrated circuit 1 that makes it possible to further increase the integration density. Several memory locations 3 comprise two cells on either side of pads 34. Several memory locations comprise common pads 474. Selection transistors 2 and 4 are also connected and comprise pads 275 that are common with cells of end memory locations 3.

The top view illustrated in FIG. 53 represents another variant of an integrated circuit 1 that makes it possible to optimize the integration density. Several memory locations 3 comprise two cells on either side of pads 24. Transistors 2 and 4 are positioned on either side of each memory location 3. The pad 24 is used as common pad for the gate of a transistor 2, the gate of a transistor 4, and an electrode of a memory location 3.

The top view illustrated in FIG. 54 represents another variant of an integrated circuit 1 that makes it possible to optimize the integration density, in the particular case of transistors of FinFET type, that is to say transistors having a three-dimensional active zone. The pad 24 is used as a common pad for the gates of several transistors 2, and for the electrodes of several memory locations 3.

The invention claimed is:
1. A process for fabricating an integrated circuit comprising a field-effect transistor and a memory cell of OxRam type, the process comprising:
 providing a substrate comprising a semiconductor layer, the substrate being equipped with first and second dummy gates and with an encapsulation layer in which said dummy gates are positioned, at least the first dummy gate being formed on the semiconductor layer of the substrate;
 removing the first and second dummy gates in order to make first and second grooves in said encapsulation layer;
 simultaneously depositing a gate insulating layer at least in the bottom of the first groove and on a side wall of the second groove; and
 forming a gate electrode of said field-effect transistor in the first groove on top of said gate insulating layer, forming source and drain electrodes of said transistor on either side of said gate electrode, and forming first and second electrodes of said memory cell on either side of said gate insulating layer deposited on a side wall of the second groove.

2. The process according to claim 1, wherein the deposited gate insulating layer includes a material selected from the group consisting of $HfO_2$, HfSiON, HfAlO, TiOx, $Al_2O_3$ and NiO.

3. The process according to claim 1, wherein said first electrode formed for said memory cell also forms one of said source or drain electrodes formed for said transistor.

4. The process according to claim 1, wherein said substrate comprises an isolation trench and in which the second dummy gate is formed on said isolation trench.

5. The process according to claim 1, wherein said substrate is of silicon-on-insulator type.

6. The process according to claim 1, comprising the connection of said first and second electrodes of said memory cell to an electronic circuit configured in order to selectively apply a potential difference between the first and second electrodes inducing a conductive filament across said gate insulating layer deposited on a side wall of the second groove.

7. The process according to claim 1, comprising:
forming said encapsulation layer;
prior to the formation of said encapsulation layer, performing a blanket deposition of an insulating layer covering the first and second dummy gates;
masking of said insulating layer at the first dummy gate and the removal of said insulating layer on top of and either side of the second dummy gate; and
preserving a portion of said insulating layer on either side of said gate electrode formed, so as to form spacers for said gate electrode.

8. The process according to claim 1, comprising the formation of an insulating wall positioned between said first and second electrodes of the memory cell, the insulating wall including said gate insulating layer deposited on a side wall of the second groove, and having a thickness sized in order to selectively form a conductive filament during the application of a potential difference between the first and second electrodes.

9. The process according to claim 8, further comprising forming an additional insulating layer in said second groove on said gate insulating layer, said additional insulating layer being included in said insulating wall positioned between said first and second electrodes.

10. The process according to claim 1, wherein the formation of the source and drain electrodes and said first electrode of the memory cell includes the formation of additional grooves in the encapsulation layer, on either side of the first groove and to the side of the second groove.

11. The process according to claim 10, comprising depositing a protective layer in the first and second grooves respectively on said gate electrode and said second electrode of the memory cell, said protective layer being formed from a material different from the encapsulation layer, the formation of said additional grooves including a self-aligned etching of the encapsulation layer on either side of the protective layer.

12. The process according to claim 10, wherein the formation of the source and drain electrodes and said first electrode of the memory cell comprises:
the formation of a titanium layer on the walls of said additional grooves;
the formation of a titanium nitride layer on the titanium layer; and
the deposition of a metal layer on said titanium layer.

13. The process according to claim 10, wherein said masking and said removal are carried out prior to said formation of said encapsulation layer.

14. The process according to claim 10, wherein said masking and said removal are carried out subsequent to the formation of said additional grooves.

* * * * *